US 11,153,985 B2

(12) United States Patent
Andrew et al.

(10) Patent No.: US 11,153,985 B2
(45) Date of Patent: Oct. 19, 2021

(54) MODULAR HYBRID CIRCUIT PACKAGING

(71) Applicant: Rosemount Inc., Shakopee, MN (US)

(72) Inventors: David Alexander Andrew, Wenatchee, WA (US); David Matthew Strei, Waconia, MN (US); James Walters, III, Malaga, WA (US); David Cutter, East Wenatchee, WA (US)

(73) Assignee: ROSEMOUNT INC., Shakopee, MN (US)

( * ) Notice: Subject to any disclaimer, the term of this patent is extended or adjusted under 35 U.S.C. 154(b) by 0 days.

(21) Appl. No.: 15/636,870

(22) Filed: Jun. 29, 2017

(65) Prior Publication Data

US 2019/0008062 A1 Jan. 3, 2019

(51) Int. Cl.
*H05K 5/06* (2006.01)
*H05K 1/18* (2006.01)
(Continued)

(52) U.S. Cl.
CPC .......... *H05K 5/069* (2013.01); *G01L 19/0069* (2013.01); *G01L 19/0084* (2013.01); *G01L 19/147* (2013.01); *G01L 19/148* (2013.01); *H01L 23/057* (2013.01); *H01L 23/10* (2013.01); *H01L 25/165* (2013.01); *H05K 1/181* (2013.01); *H05K 5/0047* (2013.01); *H05K 13/04* (2013.01); *H01L 2224/48091* (2013.01);
(Continued)

(58) Field of Classification Search
CPC ...... H05K 5/069; H05K 1/181; H05K 5/0047; H05K 13/04; G01L 19/148; G01L 19/147; H01L 25/165; H01L 23/10; H01L 23/057; H01L 2224/48091; H01L 2224/48227; H01L 2224/49175; H01L 2924/19105; H01L 2924/19107
See application file for complete search history.

(56) References Cited

U.S. PATENT DOCUMENTS 3,561,831 A * 2/1971 Alibert et al. ........ G01L 9/0001
310/338
4,208,698 A 6/1980 Narasimhan
(Continued)

FOREIGN PATENT DOCUMENTS

JP 8-201203 8/1996
JP 11-44599 2/1999
(Continued)

OTHER PUBLICATIONS

Invitation to Pay Additional Fees and, Where Applicable, Protest Fees, from PCT/US2018/027226, dated Jul. 11, 2018.
(Continued)

*Primary Examiner* — Adrian S Wilson
*Assistant Examiner* — Theron S Milliser
(74) *Attorney, Agent, or Firm* — Westman, Champlin & Koehler, P.A.

(57) ABSTRACT

An electronics package includes a platform and a board mounted to the platform, the board having electronics mounted thereon. A feedthrough pin passes through and is hermetically sealed to a feedthrough body and is wire bonded to the board. A cover is bonded to and surrounds the exterior surface of the feedthrough body to produce a hermetically sealed chamber that houses the platform and the board.

17 Claims, 10 Drawing Sheets

(51) Int. Cl.
*H05K 5/00* (2006.01)
*H05K 13/04* (2006.01)
*G01L 19/14* (2006.01)
*H01L 25/16* (2006.01)
*G01L 19/00* (2006.01)
*H01L 23/10* (2006.01)
*H01L 23/057* (2006.01)

(52) U.S. Cl.
CPC ............ *H01L 2224/48227* (2013.01); *H01L 2224/49175* (2013.01); *H01L 2924/19105* (2013.01); *H01L 2924/19107* (2013.01)

(56) References Cited

U.S. PATENT DOCUMENTS

| | | | | |
|---|---|---|---|---|
| 4,424,404 A * | 1/1984 | Moore | ............... | H05K 7/1417 |
| | | | | 174/564 |
| 4,620,438 A | 11/1986 | Howng | | |
| 4,797,007 A * | 1/1989 | Elmore, III | ............ | G01K 13/02 |
| | | | | 374/143 |
| 4,930,353 A * | 6/1990 | Kato | ............... | G01L 9/06 |
| | | | | 338/4 |
| 4,958,938 A * | 9/1990 | Schwartz | ............... | G01K 1/10 |
| | | | | 136/230 |
| 5,181,417 A | 1/1993 | Nishida et al. | | |
| 5,353,200 A * | 10/1994 | Bodin | ............... | G01L 19/02 |
| | | | | 174/382 |
| 5,524,333 A * | 6/1996 | Hogue | ............... | H01H 35/34 |
| | | | | 29/593 |
| 5,587,535 A * | 12/1996 | Sasaki | ............... | G01L 9/0051 |
| | | | | 338/4 |
| 5,606,513 A * | 2/1997 | Louwagie | ............... | G01F 1/363 |
| | | | | 702/138 |
| 5,747,694 A * | 5/1998 | Baba | ............... | G01L 19/0038 |
| | | | | 73/723 |
| 5,932,808 A * | 8/1999 | Hayashi | ............... | G01L 9/0075 |
| | | | | 73/718 |
| 6,105,437 A * | 8/2000 | Klug | ............... | G01L 19/148 |
| | | | | 73/756 |
| 6,176,137 B1 | 1/2001 | Sasaki et al. | | |
| 6,487,898 B1 * | 12/2002 | Haefner | ............... | G01L 23/18 |
| | | | | 73/114.18 |
| 6,603,182 B1 * | 8/2003 | Low | ............... | B81B 7/0077 |
| | | | | 257/432 |
| 6,722,205 B2 * | 4/2004 | Bodin | ............... | G01L 19/0038 |
| | | | | 73/756 |
| 6,938,491 B2 * | 9/2005 | Clark | ............... | G01L 23/10 |
| | | | | 73/753 |
| 7,000,478 B1 * | 2/2006 | Zwollo | ............... | G01K 1/08 |
| | | | | 374/E1.011 |
| 7,190,053 B2 * | 3/2007 | Orth | ............... | H05K 1/0218 |
| | | | | 257/659 |
| 7,441,461 B2 * | 10/2008 | Muth | ............... | G01L 19/0092 |
| | | | | 73/756 |
| 7,538,401 B2 * | 5/2009 | Eriksen | ............... | C23C 14/021 |
| | | | | 257/419 |
| 7,726,269 B2 * | 6/2010 | Ramond | ............... | G01L 23/22 |
| | | | | 123/143 R |
| 8,371,175 B2 * | 2/2013 | Romo | ............... | G01L 19/0007 |
| | | | | 73/753 |
| 9,638,600 B2 * | 5/2017 | Haywood | ............... | G01L 9/0041 |
| 9,709,272 B2 * | 7/2017 | Scholzen | ............... | F23Q 7/001 |
| 9,964,459 B2 * | 5/2018 | Brown | ............... | G01L 9/0022 |
| 10,018,033 B2 * | 7/2018 | Leeflang | ............... | E21B 17/206 |
| 10,132,156 B2 * | 11/2018 | Leeflang | ............... | E21B 47/06 |
| 2005/0103111 A1 * | 5/2005 | Imai | ............... | G01L 9/0055 |
| | | | | 73/715 |
| 2006/0214909 A1 | 9/2006 | Poh et al. | | |
| 2009/0140572 A1 | 6/2009 | Kim | | |
| 2009/0320576 A1 * | 12/2009 | Borgers | ............... | G01L 23/18 |
| | | | | 73/114.18 |
| 2010/0192696 A1 * | 8/2010 | Schlitzkus | ............... | G01L 19/148 |
| | | | | 73/756 |
| 2012/0067130 A1 * | 3/2012 | Kaiser | ............... | B60T 8/368 |
| | | | | 73/706 |
| 2012/0297886 A1 * | 11/2012 | Lee | ............... | G01L 9/0055 |
| | | | | 73/720 |
| 2013/0192379 A1 * | 8/2013 | Petrarca | ............... | G01L 9/00 |
| | | | | 73/754 |
| 2014/0331776 A1 * | 11/2014 | Petrarca | ............... | G01L 9/0051 |
| | | | | 73/723 |
| 2014/0352415 A1 * | 12/2014 | Groenhuijzen | ............... | F02B 77/085 |
| | | | | 73/114.18 |
| 2016/0033365 A1 * | 2/2016 | Joly | ............... | G01M 15/08 |
| | | | | 73/114.18 |
| 2017/0030790 A1 | 2/2017 | Buck et al. | | |

FOREIGN PATENT DOCUMENTS

JP  H11351990 A  12/1999
JP  2008-232931  10/2008
WO  WO 2015/121486  8/2015

OTHER PUBLICATIONS

Notification of Transmittal of the International Search Report and the Written Opinion of the International Searching Authority from PCT/US2018/027226, dated Oct. 2, 2018.
Communication from European Patent Applicaiton No. 18721234.5, dated Feb. 7, 2020.
Office Action from Japanese Patent Application No. 2019-572177, dated Feb. 24, 2021.
Examiner's Report from Canadian Patent Application No. 3,068,397, dated Feb. 26, 2021.

* cited by examiner

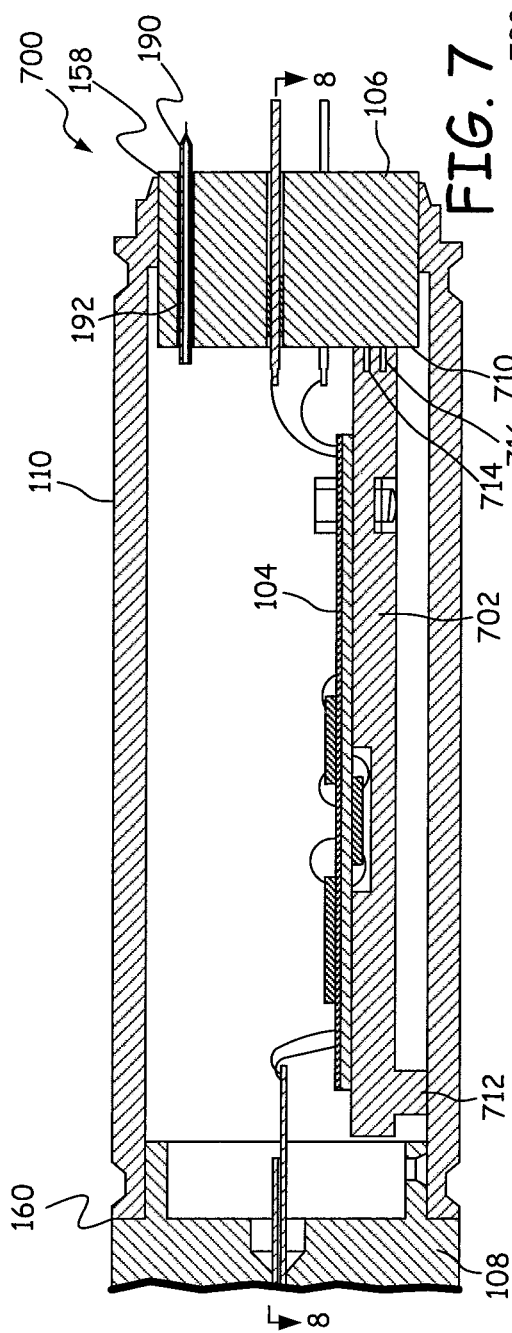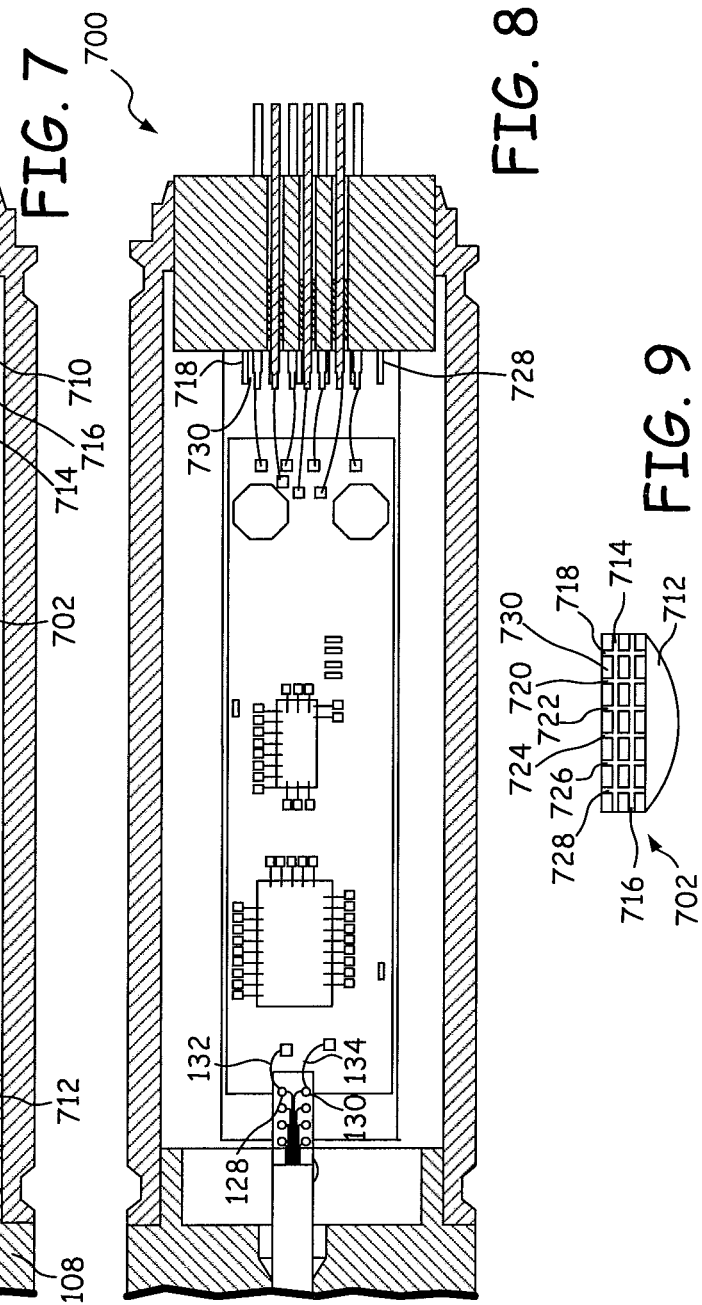

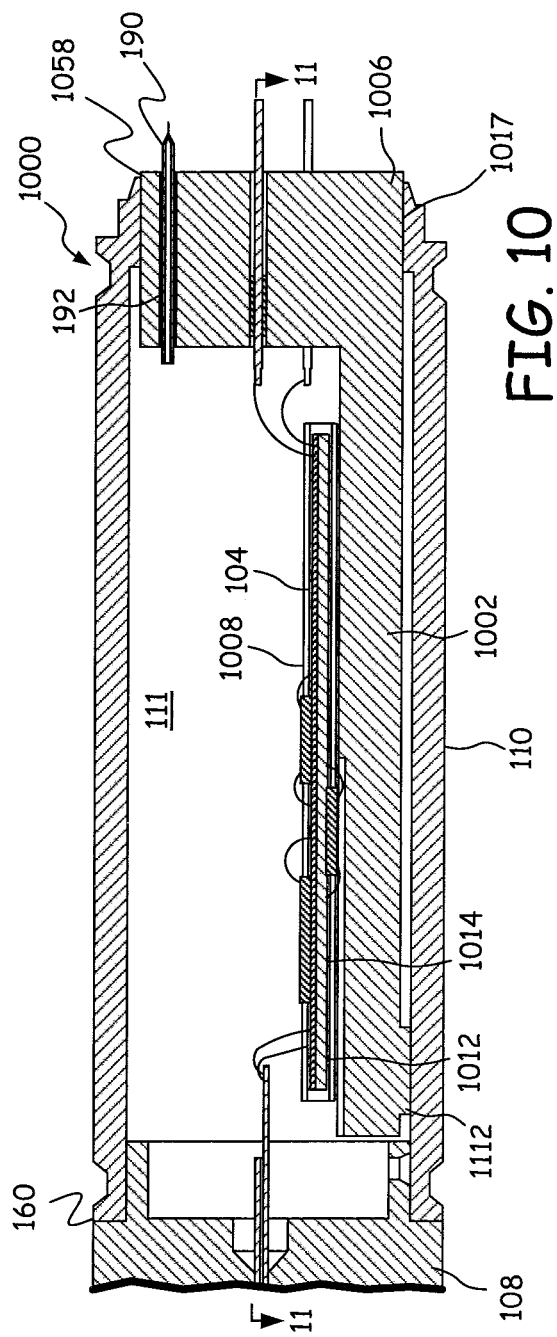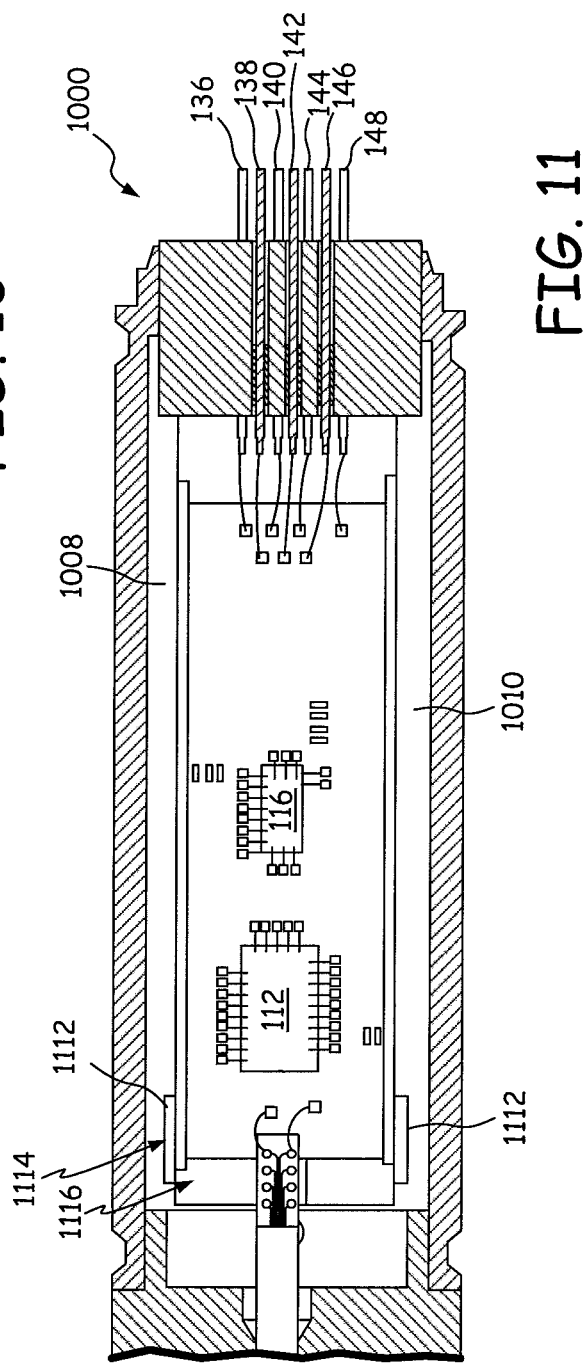

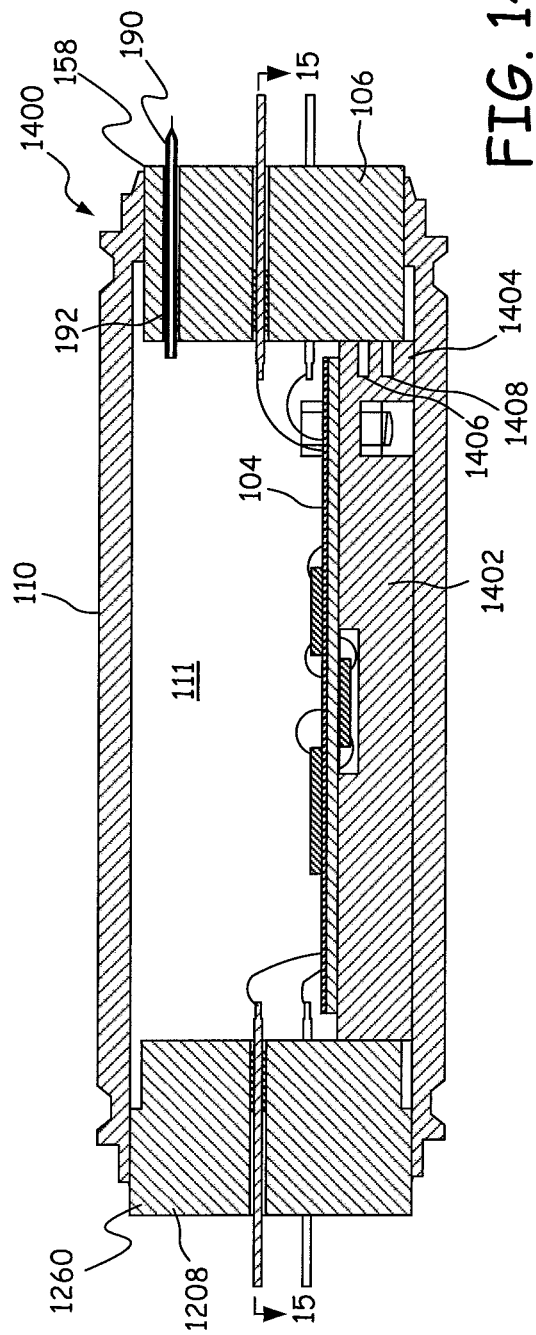
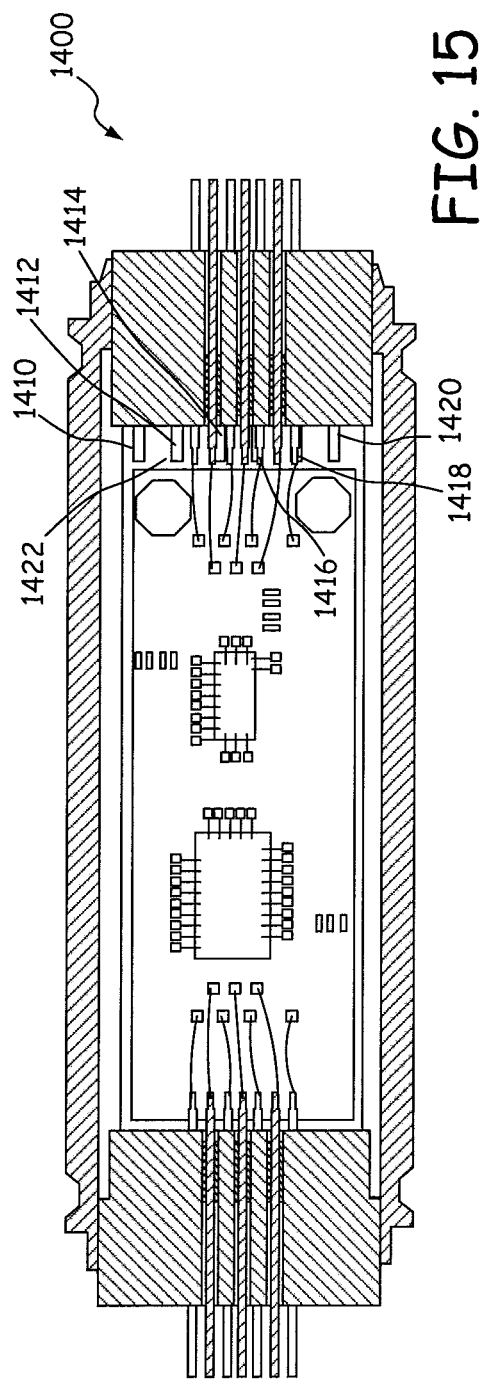

MODULAR HYBRID CIRCUIT PACKAGING

FIELD

The various embodiments relate to electronic packages. In particular, the embodiments relate to electronic packages containing hybrid electronics boards.

BACKGROUND

Hybrid integrated circuits are electronic circuits constructed of individual components mounted to a substrate or a printed circuit board. Some of the components are wire bonded to the substrate by connecting a wire between a conductive pad on the substrate and a pad on the component after the component has been mounted to the substrate.

In the process control industry, hybrid electronics are often placed in or near corrosive environments that will corrode the wire bonds or the components of the hybrid integrated circuit. Common uses for hybrid circuits are in high temperature applications that can oxidize or cause inter-metallic formations if not properly packaged. Other applications have constraints on packaging size.

SUMMARY

An electronics package includes a board mounted to a platform, the board having electronics mounted thereon. At least one feedthrough body has an exterior surface and a feedthrough pin passes through and is hermetically sealed to the feedthrough body and is connected to the board. A cover is attached to and surrounds the exterior surface of the feedthrough body to produce a hermetically sealed chamber that houses the platform and the board.

In a further embodiment, an electronics package includes a feedthrough body, a second body and a cover bonded to the feedthrough body and the second body to form a hermetically sealed chamber. A platform is positioned between the feedthrough body and the second body within the sealed chamber. A board having electrical components mounted thereon is mounted to the platform within the chamber.

In a still further embodiment, a method includes mounting a board having electronics onto a platform that is devoid of electronics and placing the platform and board between a feedthrough body and a second body. A feedthrough pin that passes through the feedthrough body is wire bonded to the board. A cover with an open top and bottom is then placed around the platform and the cover is sealed to the feedthrough body and the second body to form a chamber containing the board.

In a still further embodiment an electronics package includes a feedthrough body having a slot and a cover bonded to the feedthrough body to form a hermetically sealed chamber. A board having electrical components mounted thereon is positioned in and mounted to the slot in the feedthrough body.

BRIEF DESCRIPTION OF THE DRAWINGS

FIG. 7 is a side sectional view of a fourth embodiment of a hybrid circuit package.

FIG. 8 is a top sectional view of the hybrid circuit package of FIG. 7.

FIG. 9 is a front sectional view of the platform of the hybrid circuit package of FIG. 7.

FIG. 10 is a side sectional view of a fifth embodiment of a hybrid circuit package.

FIG. 11 is a top sectional view of the hybrid circuit package of FIG. 10.

FIG. 14 is a side sectional view of a seventh embodiment of a hybrid circuit package.

FIG. 15 is a top sectional view of the hybrid circuit package of FIG. 14.

DETAILED DESCRIPTION OF ILLUSTRATIVE EMBODIMENTS

In many hybrid electronics packages, the board carrying the electronics is mounted to a cover or the exterior of a feedthrough body of the packaging. Since covers and feedthrough bodies are constructed of materials having different thermal expansion characteristics than the electronics board, the mounting medium between the board and the cover or feedthrough body tends to fail if the electronics package is exposed to multiple heating and cooling cycles. When the electronics package breaks free from the cover or feedthrough body, the movement of the electronics board tends to break one or more wire bonds between the electronics board and feedthrough pins that pass through the feedthrough body in the electronics package.

In the embodiments described herein, movement of the electronics board within the package is reduced by mounting the electronics board to a platform that has thermal expansion characteristics that are similar or match the thermal expansion characteristics of the board. The platform is maintained in a stable position within the package by positioning the platform between, and in some embodiments, connecting the platform to, bodies on either end of the package, such as feedthrough bodies that contain feedthrough pins and a sensor body that contains one or more sensors. Thus, the board is allowed to expand and contract during heating cycles without breaking free from the platform and the platform is maintained in its position within the package based on contact and/or connections with feedthrough bodies and/or sensor bodies at the ends of the package.

Figure 1:
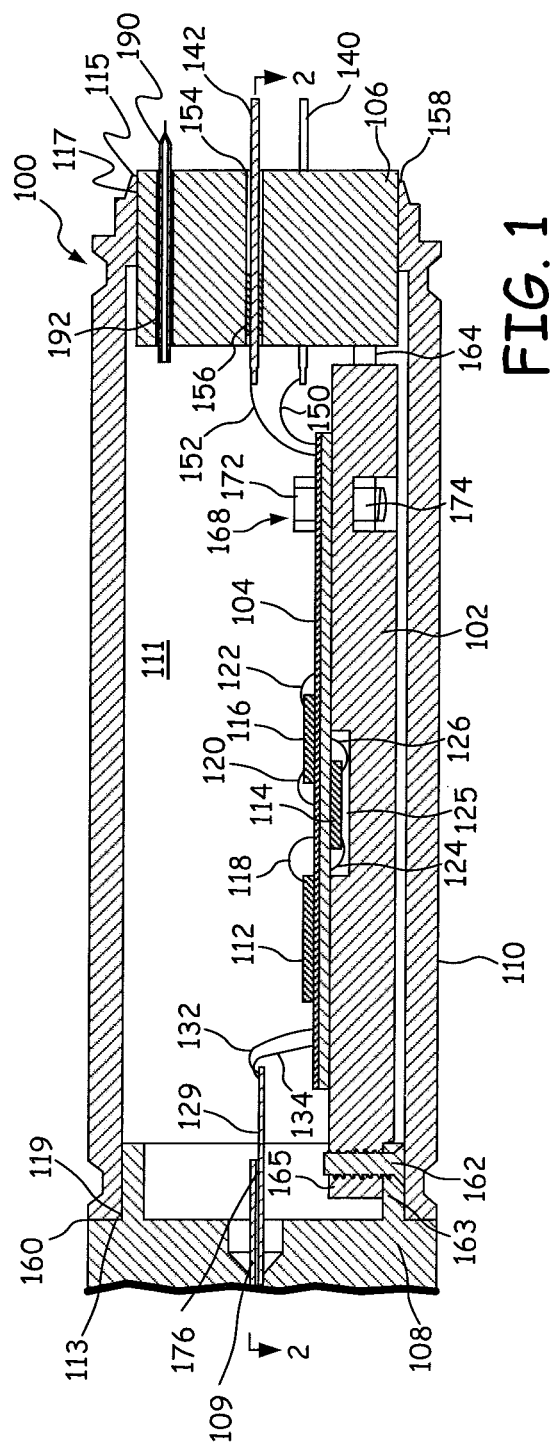
FIG. 1 is a side sectional view of a first embodiment of a hybrid circuit package.
Figure 2:
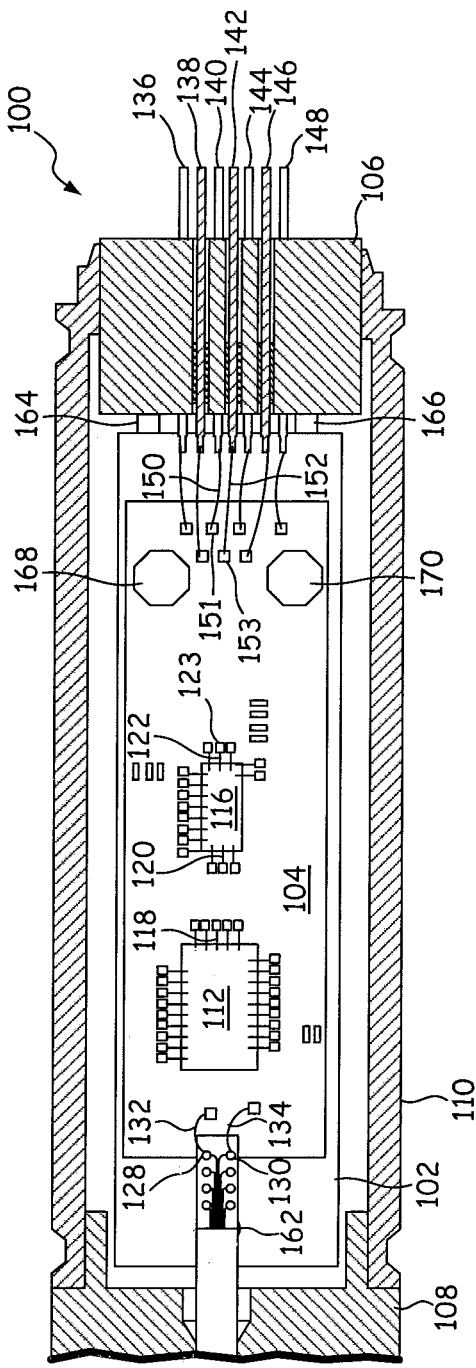
FIG. 2 is a top sectional view of the hybrid circuit package of FIG. 1.

FIGS. 1 and 2 provide a side sectional view and a top sectional view, respectively, of an electronics package 100 in accordance with one embodiment. Electronics package 100 includes a platform 102 having a hybrid electronics board 104 mounted thereon. In accordance with one embodiment, platform 102 is devoid of electronics in the sense that no electronics are mounted directly to platform 102 and platform 102 does not include any electrical traces, pads, or conductors. Platform 102 and hybrid electronics board 104 have similar thermal expansion characteristics including similar coefficients of thermal expansion. Examples of materials for hybrid electronics board 104 include Alumina, Aluminum Nitride, and cofired ceramics. In accordance with one embodiment, hybrid electronics board 104 is made of a low off gassing laminar electronics board.

Platform 102 and hybrid electronics board 104 are positioned between a feedthrough body 106 and a sensor body 108 within a chamber 111 defined by a cover 110, feedthrough body 106, and sensor body 108. In accordance with one embodiment, cover 110 is hollow and has two open ends 113 and 115 with sensor body 108 positioned at and sealed to open end 113 and feedthrough body 106 positioned at and sealed to open end 115. In the embodiments of FIGS. 1 and 2, cover 110 is shown as a cylinder, but in other embodiments, cover 110 may take the form of an n-sided prism having any desired number of sides n.

In this embodiment, cover 110 surrounds and contacts an exterior surface 117 of feedthrough body 106 and is hermetically sealed to feedthrough body 106 through brazing or welding to form a cylindrical seal 158 at end 115. Similarly, cover 110 surrounds and contacts an exterior surface 119 of sensor body 108 and is hermetically sealed to sensor body 108 through brazing or welding to form a cylindrical seal 160 at end 113. Seals 158 and 160 create a hermetically sealed chamber 111 in which platform 102 and hybrid electronics board 104 are located. In accordance with one embodiment, cover 110, feedthrough body 106, sensor body 108 and hermetical seals 158 and 160 are able to withstand an exterior pressure difference between chamber 111 and the area exterior to cover 110. In addition, cover 110, feedthrough body 106 and seals 158 and 160 act as a second barrier to process fluid and pressure if process fluid enters into the interior of sensor body 108.

In accordance with some embodiments, chamber 111 contains a vacuum or an inert gas. In other embodiments, described further below, chamber 111 is filled with a high density gas, liquid or powder to reduce/prevent wire bond vibration.

In accordance with one embodiment, cover 110 has different thermal expansion characteristics than those of platform 102 and hybrid electronics board 104 including different coefficients of thermal expansion.

Hybrid electronics board 104 includes electronics components, such as electronic components 112, 114 and 116, which are mounted to hybrid electronics board 104. Examples of mounting techniques for mounting the components to hybrid electronics board 104 include solder, braze, glass sintering, and adhesive. In addition, wire bonds, such as wire bonds 118, 120, 122, 124 and 126 connect conductive pads formed in a metallization layer on electronics hybrid board 104 to pads on the electronic components. For example, wire bond 122 connects pad 123 on electronics hybrid board 104 to a pad on electronic component 116. The metallization layers can be formed of eNiPiG, ENiG, electroplated gold, thick film silver and sputtered aluminum, for example. The wire bonds can be made of gold or aluminum, for example. As shown in FIG. 1, under some embodiments, components are placed on both sides of hybrid electronics board 104. For electronics components that face platform 102, recesses, such as recess 125, are provided in platform 102 to accommodate the electronics components.

In this embodiment, hybrid electronics board 104 is also wire bonded to sensor pads 128 and 130 on an electrical connection surface 129 of a sensor array 109 by respective wire bonds 132 and 134. Sensor pads 128 and 130 are conductors that are connected to one or more sensor modules of sensor array 109 housed in sensor body 108 or chamber 111 and transmit sensor signals and/or power from/to the sensors. Examples of possible sensor modules include pressure and/or temperature sensor modules.

Hybrid electronics board 104 is also wire bonded to feedthrough pins 136, 138, 140, 142, 144, 146 and 148, which pass through the feedthrough body 106 and are sealed to feedthrough body 106 by a sealing material, such as glass or ceramic. For example, pin 142 passes through opening 154 in feedthrough body 106 and is sealed to feedthrough body 106 by glass cylindrical sealing layer 156. The wire bonds, such as wire bonds 150 and 152, connect respective feedthrough pins to conductive pads, such as conductive pads 151 and 153, on hybrid electronics board 104.

Platform 102 is preferably mounted to sensor body 108 by a fastener 162 that passes through a cylindrical portion 163 of sensor body 108 and an end portion 165 of platform 102. In particular, platform 102 is notched at end portion 165 to accept cylindrical portion 163 of sensor body 108. In alternative embodiments, platform 102 is attached to sensor body 108 by other types of mechanical fasteners or by a weld or adhesive. In this embodiment, platform 102 is also supported by two pins or dowels 164 and 166 that extend between and into feedthrough body 106 and platform 102. In accordance with one embodiment, pins 164 and 166 may be press fit into feedthrough body 106 and platform 102 in such a way as to allow platform 102 to expand and contract during heating and cooling cycles while maintaining platform 102 in a stable position relative to feedthrough body 106 and sensor body 108 such that wire bonds, such as wire bonds 150 and 152 and 132 and 134, are not damaged during movement of electronics package 100.

In one embodiment, hybrid electronics board 104 is mounted to platform 102 using one or more fasteners such as fasteners 168 and 170. In accordance with one embodiment, fasteners 168 and 170 are constructed of a bolt 172 and a nut 174.

In accordance with one embodiment, sensor array 109 includes a reference pressure sensor 176 that is mounted in pressure chamber 111 so that the output of the sensor can be used as a reference pressure for the other sensors of sensor array 109.

Figure 3:
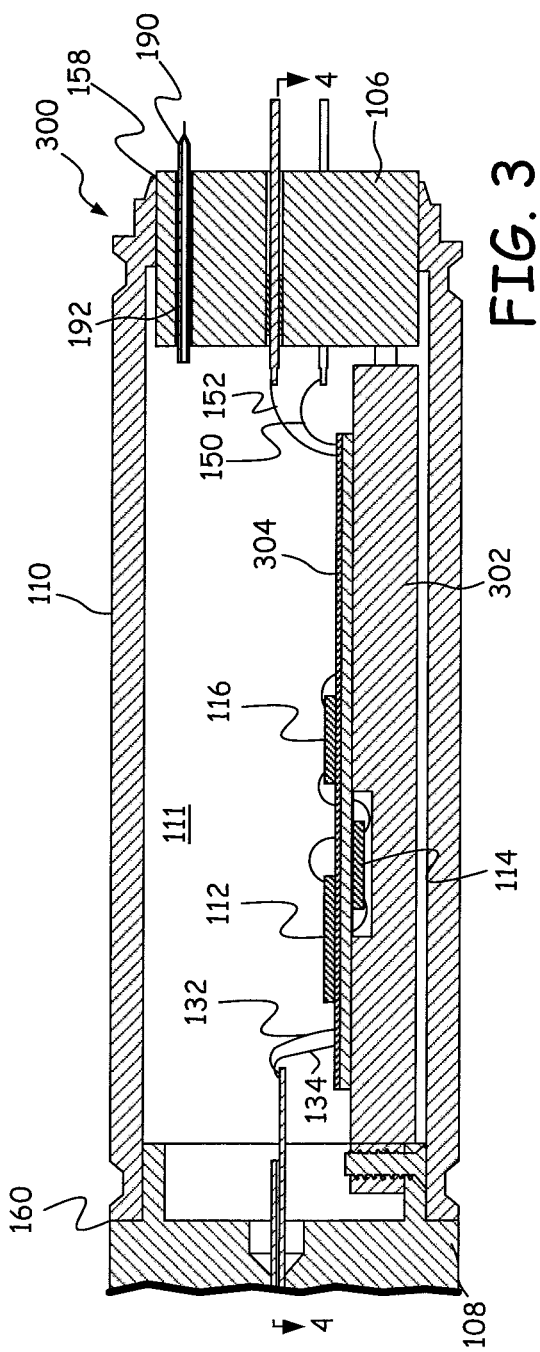
FIG. 3 is a side sectional view of a second embodiment of a hybrid circuit package.
Figure 4:
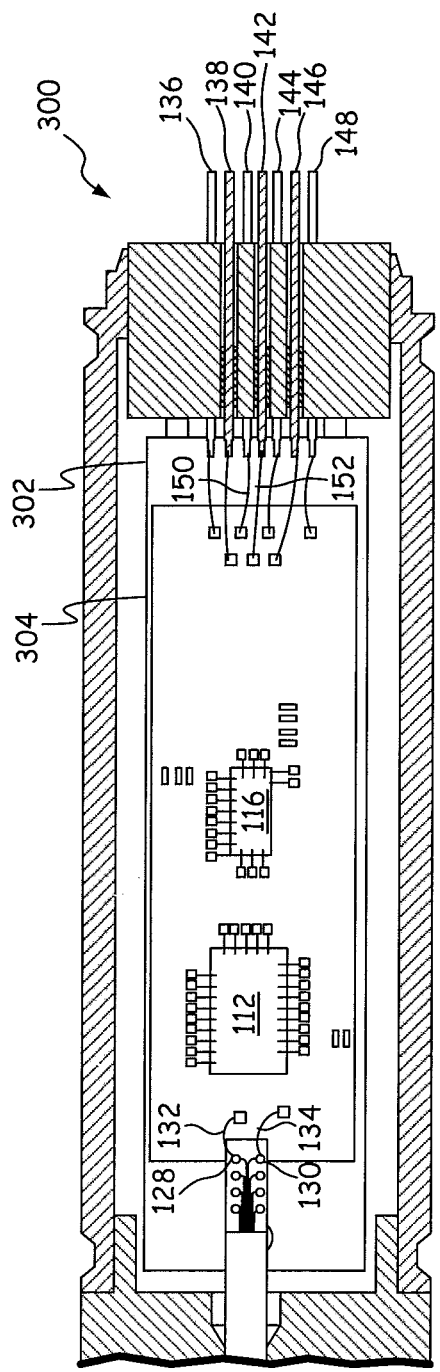
FIG. 4 is a top view of the hybrid circuit package of FIG. 3.

FIGS. 3 and 4 provide a side sectional view and a top sectional view, respectively of an electronics package 300 providing a second embodiment of an electronics package. Electronics package 300 is identical to electronics package 100 with the exception that a hybrid electronics board 304 and a platform 302 are used in place of hybrid electronics board 104 and platform 102 of package 100. Platform 302 has similar thermal expansion characteristics to hybrid electronics board 304 and different thermal expansion characteristics from cover 110.

The difference between platform 302 and platform 102 and hybrid electronics board 304 and hybrid electronics board 104 is how hybrid electronics board 304 is mounted to platform 302. In particular, instead of using fasteners 168 and 170 to mount hybrid electronics board 304 to platform 302, electronics package 300 uses one of a braze, solder, glass, epoxy or an adhesive to mount hybrid electronics board 304 to platform 302. In one embodiment, the adhesive allows board 304 to have different thermal expansion characteristics from platform 302. As a result of these types of connection, no openings or recesses are required in platform 302 and hybrid electronics board 304 to accommodate fasteners 168 and 170. All other elements of electronics package 100 are the same in electronics package 300 of FIGS. 3 and 4.

Figure 5:
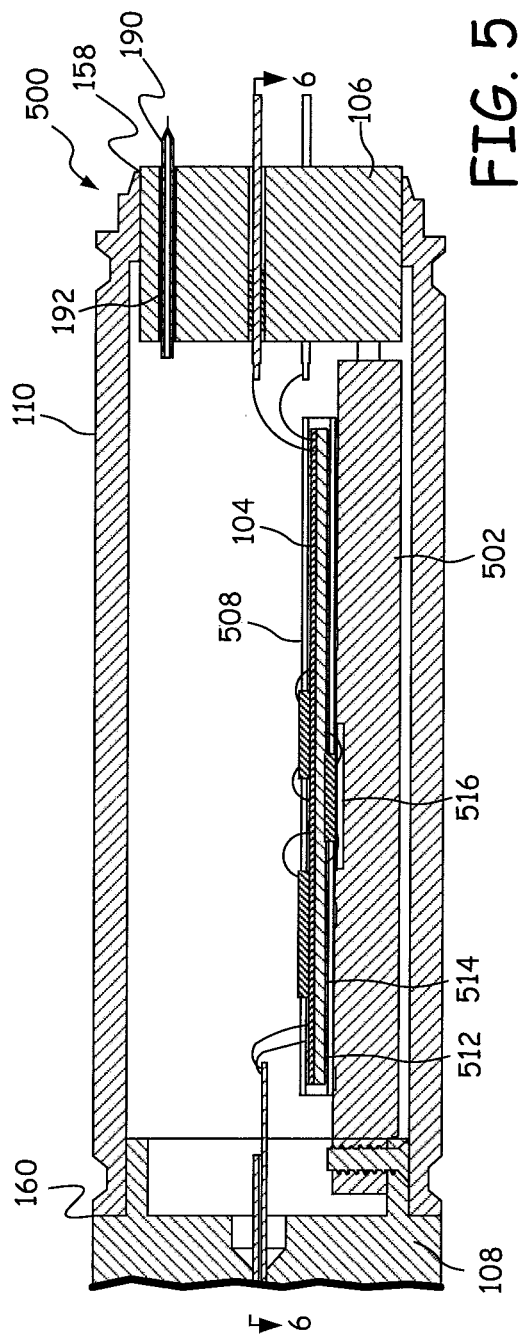
FIG. 5 is a side sectional view of a third embodiment of a hybrid circuit package.
Figure 6:
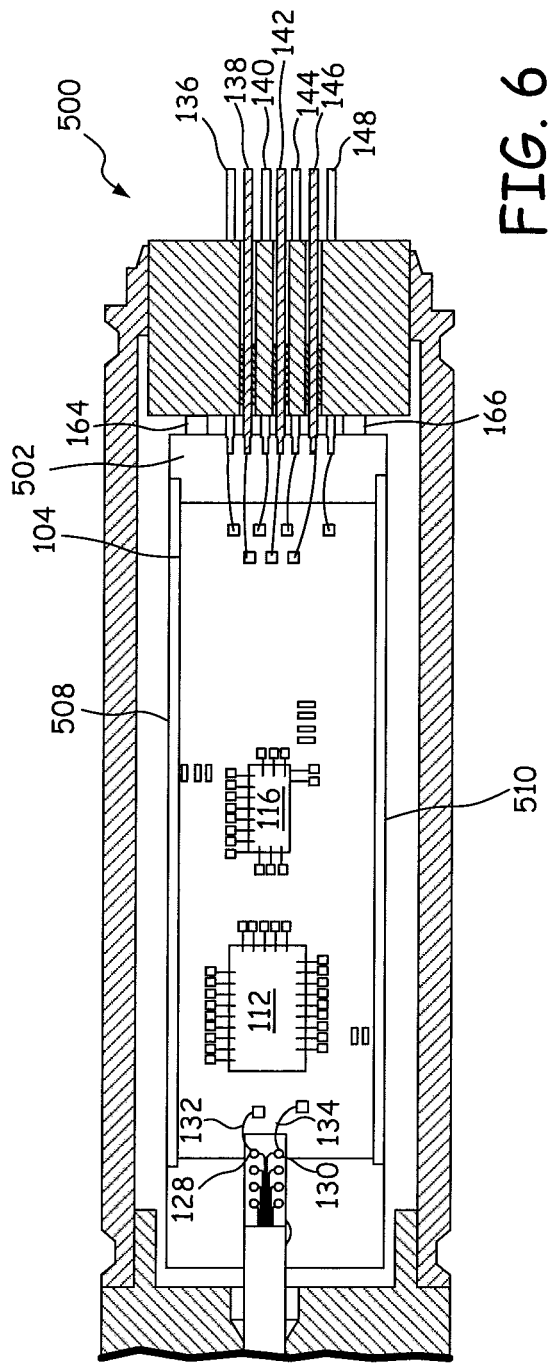
FIG. 6 is a top sectional view of the hybrid circuit package of FIG. 5.

FIGS. 5 and 6 provide a side sectional view and a top sectional view of an electronics package 500 in accordance with a third embodiment. Electronics package 500 is identical to electronics package 100 except that in electronics package 500, hybrid electronics board 104 is mounted to a platform 502 using spring rails 508 and 510 instead of using an epoxy or adhesive. Spring rails 508 and 510 are machined as part of platform 502 or are mounted to platform 502 through brazing, resistance welding or other mounting techniques such that the spring rails extend parallel to each other on opposite sides of platform 502. Each of spring rails 508 and 510 includes an open channel that faces the opposing spring rail and into which hybrid electronics board 104 is positioned. In some embodiments, hybrid electronics board 104 is secured within rails 508 and 510 by raised portions within rails 508 and 510, such as raised portions 512 and 514. Rails 508 and 510 allow hybrid electronics board 104 to move relative to platform 502 in lateral directions. Although platform 502 preferably has similar thermal expansion characteristics to hybrid electronics board 104, mounting hybrid electronics board 104 to platform 502 using rails 508 and 510 further reduces the likelihood that differences in the thermal expansion of platform 502 and board 104 will cause board 104 to break free from platform 502. Alternatively, the spring rails allow board 104 to have different thermal expansion characteristics than platform 502.

In FIGS. 5 and 6, platform 502 is mounted to sensor body 108 and is connected to feedthrough body 106 by pins 164 and 166 in the same manner as discussed above for platform 102 of the embodiment of FIGS. 1 and 2. In addition, hybrid electronics board 104 is wire bonded to feedthrough pins 136-148 and to sensor pads 128 and 130 in the same manner as discussed above for electronics package 100. Cover 110, feedthrough body 106, sensor body 108 and seals 158 and 160 are the same in electronics package 500 as they are in electronics package 100.

FIGS. 7 and 8 provide a side sectional view and a top sectional view of an electronics package 700 in accordance with a further embodiment. Electronics package 700 is identical to electronics package 100 of FIGS. 1 and 2 with the exception of platform 702 and the removal of pins 164 and 166. In particular, instead of being attached to sensor body 108, platform 702 is brazed to feedthrough body 106 at a junction 710 and is supported on cover 110 by a curved ridge 712. Platform 702 is devoid of electronics and has thermal expansion characteristics that substantially match the thermal expansion characteristics of hybrid electronics board 104. The thermal expansion characteristics of platform 702 differ from the thermal expansion characteristics of feedthrough body 106. To accommodate the differences in thermal expansion characteristics, platform 702 includes notches or cuts 714, 716, 718, 720, 722, 724, 726 and 728, which can be seen in better detail in the front view of platform 702 shown in FIG. 9. Cuts 714-728 form flexible members, such as flexible member 730 that are brazed to feedthrough body 106 at one end and are continuous with and extend from platform 702 on the other end. The flexible members bend in response to differences in the thermal expansion of feedthrough body 106 relative to platform 702 thereby avoiding placing stress on the junction between platform 702 and hybrid electronics board 104. The remaining elements of electronics package 700 are the same as package 100 of FIGS. 1 and 2.

FIGS. 10 and 11 provide a side sectional view and top sectional view of a fifth embodiment showing an electronics package 1000 in which a feedthrough body 1006 and a platform 1002 are formed of a single block of material. In particular, platform 1002 extends from a bottom portion of feedthrough body 1006 and includes a curved support ridge 1112, which contacts cover 110 to provide support for platform 1002. In accordance with one embodiment, support ridge 1112 has a top surface 1114 that is in the same plane as a top surface 1116 of the remainder of platform 1002.

Because platform 1002 is made out of the same block of material as feedthrough body 1006, platform 1002 and feedthrough body 1006 have similar thermal expansion characteristics, which are different from the thermal expansion characteristics of hybrid electronics board 104. Because of the differences in the thermal expansion characteristics, mounting hybrid electronics board 104 to platform 1002 using some adhesives would result in stress being placed on the adhesive that can cause failures in the adhesive during repeated heating and cooling cycles. To overcome this problem, electronics package 1000 uses a pair of spring rails 1008 and 1010 to mount hybrid electronics board 104 to platform 1002. Spring rails 1008 and 1010 are mounted to platform 1002 by passing posts (not shown) of spring rails 1008 and 1010 through holes (not shown) in platform 1002 such that the spring rails extend parallel to each other on opposite sides of platform 1002. Each of spring rails 1008 and 1010 includes an open channel that faces the opposing spring rail and into which hybrid electronics board 104 is positioned. In some embodiments, hybrid electronics board 104 is secured within rails 1008 and 1010 by raised portions within rails 1008 and 1010, such as raised portions 1012 and 1014. Rails 1008 and 1010 allow hybrid electronics board 104 to expand and contract relative to platform 1002 in lateral directions.

Cover 110 surrounds and contacts an exterior surface 1017 of feedthrough body 1006 and is hermetically sealed to feedthrough body 1006 through brazing or welding to form a cylindrical seal 1058 at end 115 of cover 110. The remainder of electronics package 1000 operates similarly to electronics package 100 including the sealing of cover 110 to the exterior surface of sensor body 108 by seal 160. Seals 1058 and 160 create a hermetically sealed chamber 111 in which platform 1002 and hybrid electronics board 104 are located. In accordance with one embodiment, cover 110, feedthrough body 1006, sensor body 108 and hermetical seals 1058 and 160 are able to withstand an exterior pressure difference between chamber 111 and the area outside of cover 110. In addition, cover 110, feedthrough body 1006 and seals 1058 and 160 act as a second barrier to process fluid if process fluid enters into the interior of sensor body 108. The remaining elements of electronics package 1000 are the same as the elements of electronics package 100 of FIGS. 1 and 2.

Figure 12:
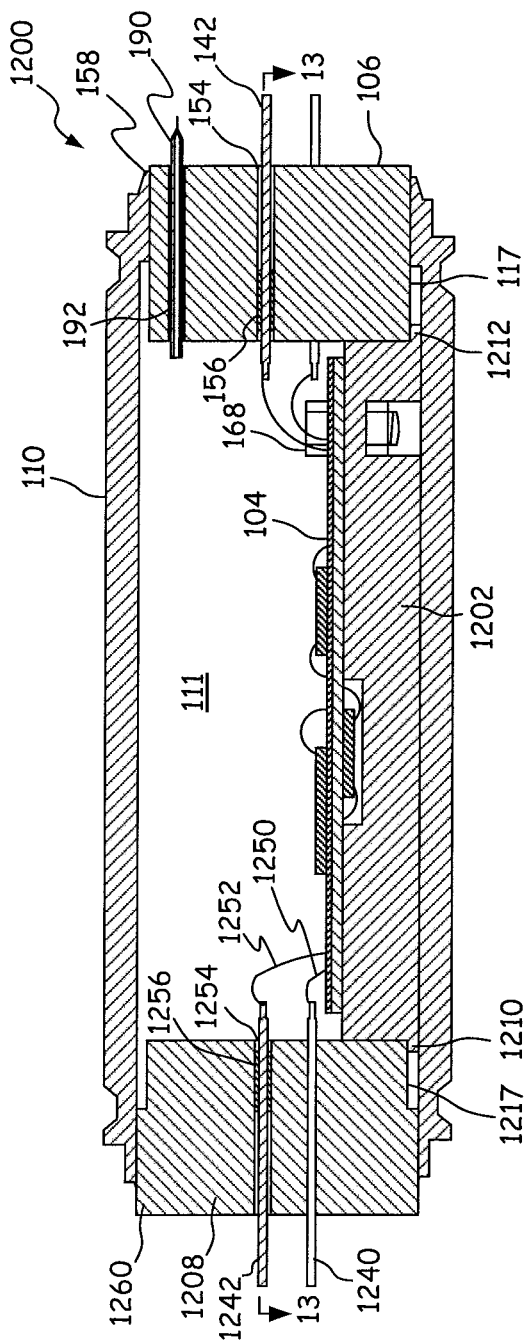
FIG. 12 is a side sectional view of a sixth embodiment of a hybrid circuit package.
Figure 13:
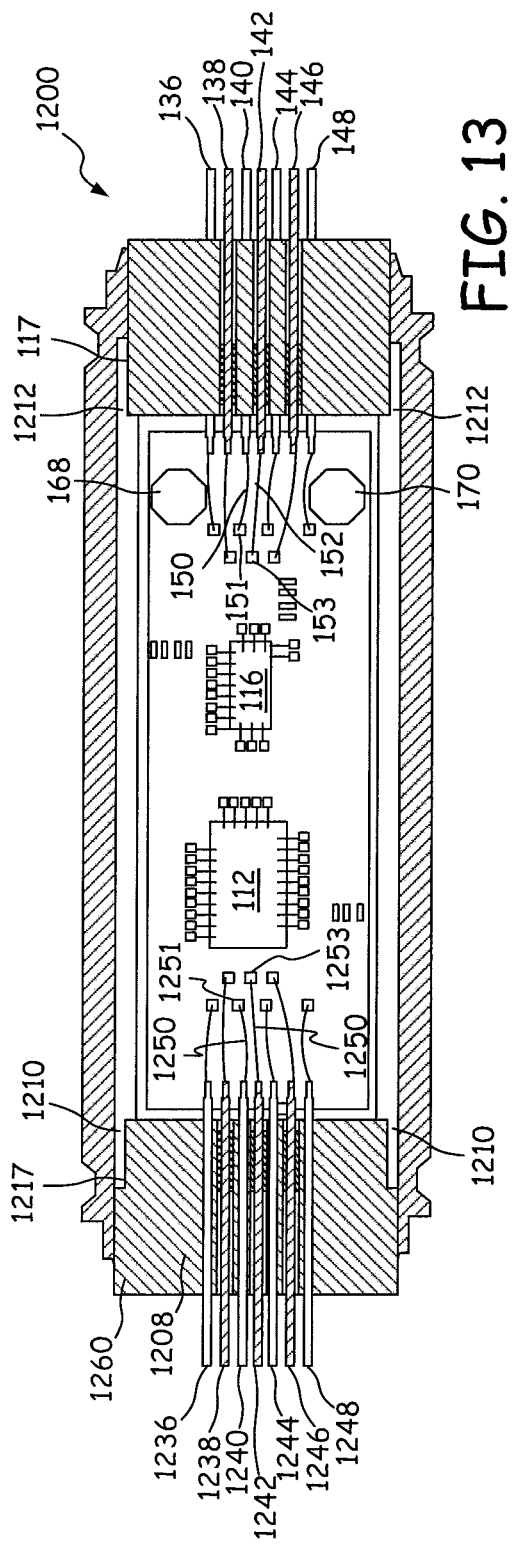
FIG. 13 is a top sectional view of the hybrid circuit package of FIG. 12.

FIGS. 12 and 13 provide a side sectional view and top sectional view, respectively, of a sixth embodiment showing an electronics package 1200. In electronics package 1200, sensor body 108 has been replaced with a second feedthrough body 1208. In the embodiment of FIG. 12, a platform 1202 has a hybrid electronics board 104 mounted to it. Platform 1202 is not mounted to either feedthrough body 106 or feedthrough body 1208. Instead, platform 1202 includes two curved tabs 1210 and 1212 that extend around a portion of cylindrical exteriors 1217 and 117 of feedthrough bodies 1208 and 106, respectively, such that tab 1210 is sandwiched between feedthrough body 1208 and cover 110 and tab 1212 is sandwiched between feedthrough body 106 and cover 110. As a result, tabs 1210 and 1212 are friction fit between feedthrough bodies 1208 and 106 and cover 110 thereby limiting the movement of platform 1202 within chamber 111.

Cover 110 surrounds and contacts exterior surface 117 of feedthrough body 106 and is hermetically sealed to feedthrough body 106 through brazing or welding to form a cylindrical seal 158 at end 115. Similarly, cover 110 surrounds and contacts exterior surface 1217 of feedthrough body 1208 and is hermetically sealed to feedthrough body 1208 through brazing or welding to form a cylindrical seal 1260 at end 113. Seals 158 and 1260 create a hermetically sealed chamber 111 in which platform 1202 and hybrid electronics board 104 are located. In accordance with one embodiment, cover 110, feedthrough body 106, feedthrough body 1208 and hermetical seals 158 and 1260 are able to withstand an exterior pressure difference between chamber 111 and the area exterior to cover 110.

Hybrid electronics board 104 is wire bonded to feedthrough pins 136, 138, 140, 142, 144, 146 and 148, which pass through feedthrough body 106 and are sealed to feedthrough body 106 by a sealing material, such as glass or ceramic. For example, pin 142 passes through opening 154 in feedthrough body 106 and is sealed to feedthrough body 106 by glass cylindrical sealing layer 156. The wire bonds, such as wire bonds 150 and 152, connect respective feedthrough pins to conductive pads, such as conductive pads 151 and 153, on hybrid electronics board 104. Hybrid electronics board 104 is further wire bonded to feedthrough pins 1236, 1238, 1240, 1242, 1244, 1246 and 1248, which pass through feedthrough body 1208 and are sealed to feedthrough body 1208 by a sealing material, such as glass or ceramic. For example, pin 1242 passes through opening 1254 in feedthrough body 1208 and is sealed to feedthrough body 1208 by glass cylindrical sealing layer 1256. The wire bonds, such as wire bonds 1250 and 1252, connect respective feedthrough pins to conductive pads, such as conductive pads 1251 and 1253, on hybrid electronics board 104.

In electronics package 1200, platform 1202 has similar thermal expansion characteristics as hybrid electronics board 104. However, platform 1202 has different thermal expansion characteristics than feedthrough body 1208 and 106. Hybrid circuit board 104 is mounted to platform 1202 using mechanical fasteners 168 and 170. However, in other embodiments, hybrid circuit board 104 is mounted to platform 1202 using an adhesive or epoxy.

FIGS. 14 and 15 provide a side sectional view and a top sectional view of a seventh embodiment showing an electronics package 1400. Electronics package 1400 is identical to electronics package 1200 with the exception that a platform 1402 is used in place of platform 1202. Platform 1402 includes a connecting portion 1404 that is brazed to feedthrough body 106. Connecting portion 1404 includes notches or cuts 1406, 1408, 1410, 1412, 1414, 1416, 1418 and 1420, which are similar to notches or cuts 714, 716, 718, 720, 722, 724, 726 and 728 of electronics package 700. Notches 1406-1414 provide bendable regions, such as bendable region 1422 that are allowed to flex to accommodate differences in the thermal expansion characteristics of feedthrough body 106 and platform 1402. Platform 1402 and hybrid electronics board 104 have similar thermal expansion characteristics to one another but differ in their thermal expansion characteristics from feedthrough body 106 and feedthrough body 1208.

In a further embodiment, instead of brazing the platform to one of the feed through bodies, the platform is connected to both feed through bodies using pins that are press fit into the feedthrough bodies and the platform in such a way as to allow platform to expand and contract during heating and cooling cycles while maintaining platform in a stable position relative to the feedthrough bodies such that wire bonds are not damaged during movement of electronics package 100.

Although embodiments above have referenced feedthrough pins in the feedthrough bodies to convey power and/or signals, in other embodiments, power and/or signals are conveyed between the electronics on the board and electronics exterior to the board through induction.

Figure 16:
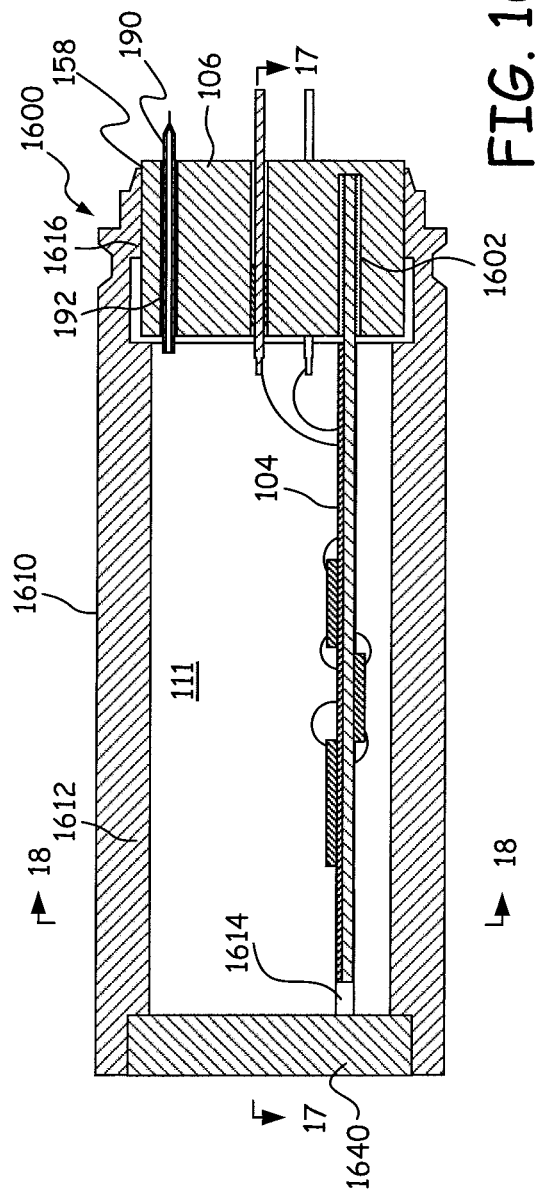
FIG. 16 is a side sectional view of an eighth embodiment of a hybrid circuit package.
Figure 17:
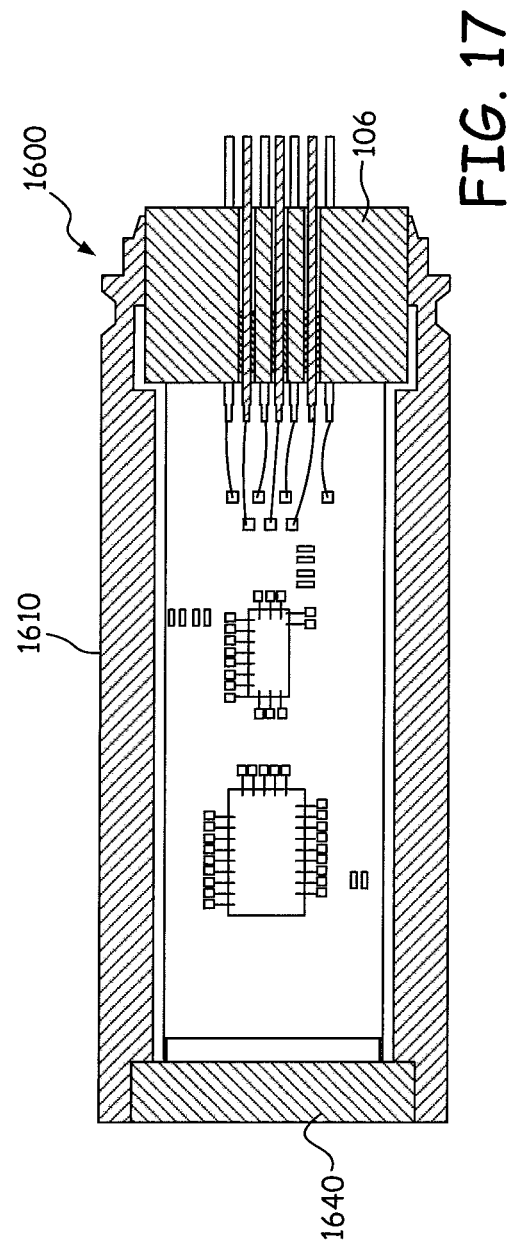
FIG. 17 is a top sectional view of the hybrid circuit package of FIG. 16.
Figure 18:
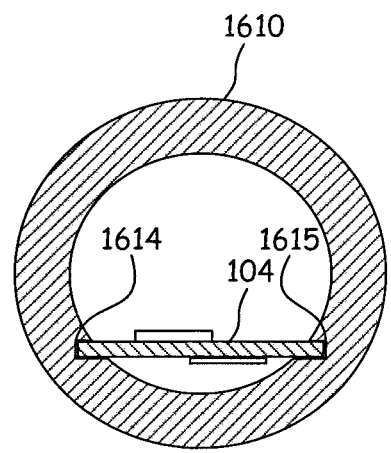
FIG. 18 is an end sectional view of the hybrid circuit package of FIG. 16.

FIGS. 16, 17, and FIG. 18 provide a side sectional view, a top sectional view, and an end sectional view of an eighth embodiment of an electronics package 1600. In electronics package 1600, hybrid electronics board 104 is mounted in and bonded to a slot 1602 in feedthrough body 106 using brazing or some other attachment means. In addition, sides of hybrid electronics board 104 are positioned within slots 1614 and 1615 in a cover 1610 that has an increased thickness in a center portion 1612 relative to an end portion 1616. In accordance with one embodiment, slots 1614 have a shape that applies a spring force to hybrid electronics board 104 while allowing hybrid electronics board 104 to move relative to cover 1610 during thermal expansion and contraction. Electronics package 1600 has a closed end 1640 that is either integral with or welded to cover 1610.

Figure 19:
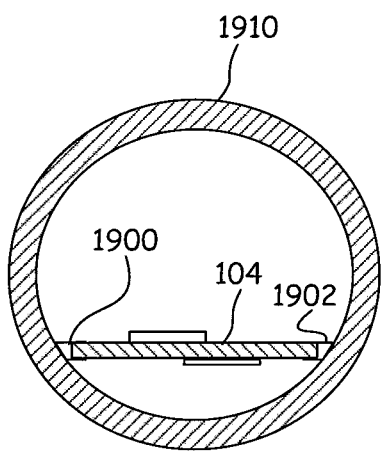
FIG. 19 is an end sectional view of a ninth embodiment of a hybrid circuit package.

FIG. 19 provides an end sectional view of a ninth embodiment that is identical to the embodiment of FIGS. 16-18 with the exception that a cover 1910 is used in place of cover 1610. The center portion of cover 1910 has a smaller thickness than center portion 1612 of cover 1610 and does not have slots. Instead, two rails 1900 and 1902 are mounted to the interior of cover 1910. The sides of hybrid electronics board 104 are mounted in rails 1900 and 1902 in the same way that the sides of hybrid electronics board 104 was mounted within slots 1614 and 1615 of cover 1610.

In accordance with one embodiment, chamber 111 in each of the electronics packages 100, 300, 500, 700, 1000, 1200, 1400 and 1600 is backfilled with gas or powder using a fill tube 190. The fill tube passes through feedthrough body 106 and is sealed to feedthrough body 106 by a cylindrical glass layer 192. Once the fill powder or gas has been pumped into chamber 111, fill tube 190 is closed either by sealing the tube with solder or pitching and welding the tube closed, as shown in the Figures. The fill material is selected to match the density of the wire bonds and thereby reduce the movement of the wire bonds when the respective packages are moved. This helps to prevent damage to the wire bonds. In other embodiments, the fill tube may be replaced with a ball seal located in the side of cover 110.

Figure 20:
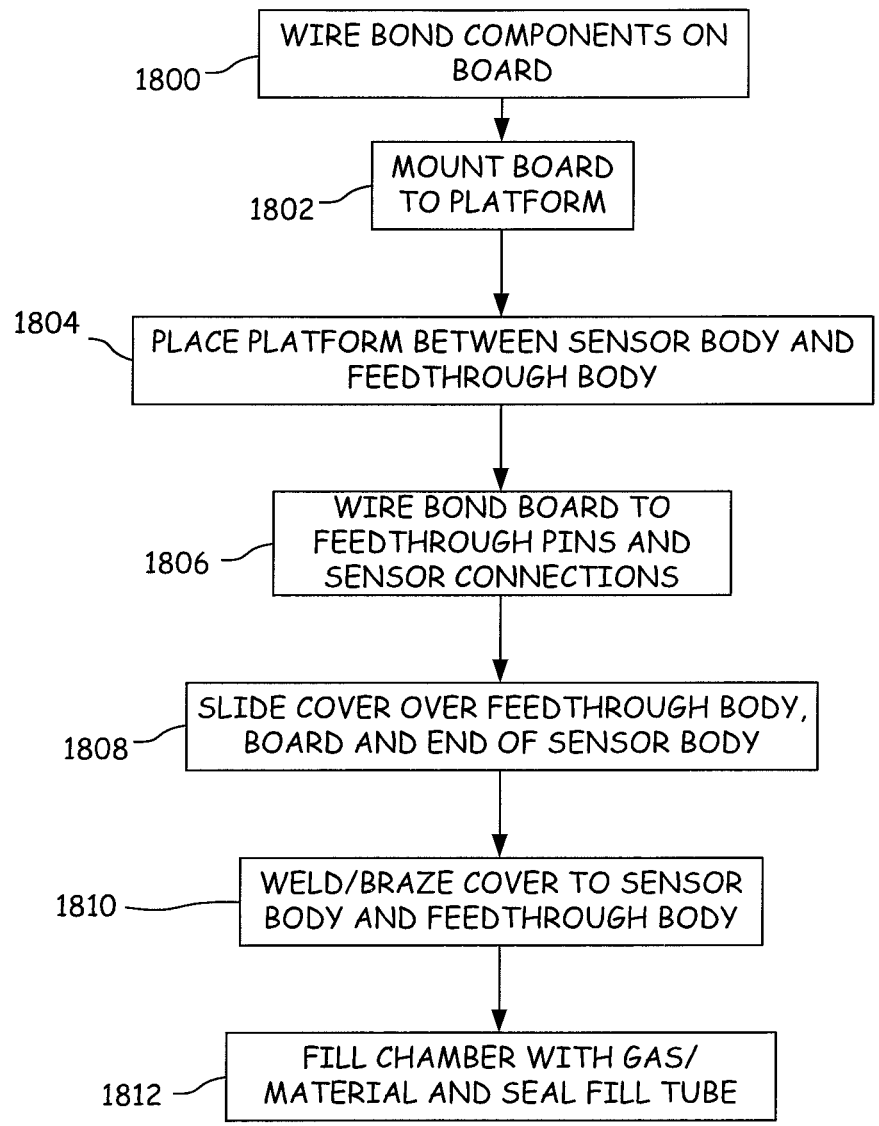
FIG. 20 is a method of manufacturing a hybrid circuit package in accordance with one embodiment.

FIG. 20 provides a method of manufacturing an electronics package in accordance with one embodiment. In step 1800, components are wire bonded onto a hybrid electronics board. The hybrid electronics board is then mounted onto a platform devoid of electronics at step 1802. The platform is then positioned between a feedthrough body and a sensor body at step 1804. The board is then wire bonded to feedthrough pins and sensor connections at step 1806. A cover is then slid over the feedthrough body, board and the end of the sensor body at step 1808. At step 1810, the cover is welded to the sensor body and feedthrough body to form a hermetically sealed chamber. At step 1812, an optional step of filling the hermetically sealed chamber with material is performed and then the fill tube is hermetically sealed.

Although the embodiments above show a single hybrid electronics board mounted to a platform, in other embodiments multiple hybrid electronics boards are stacked on top of each other or next to each other on the platform. When multiple hybrid electronics boards are used, the hybrid electronics boards can be wire bonded to each other and one or more of the hybrid electronics boards can include cutouts to make room for components mounted on other hybrid electronics boards. In addition, when multiple hybrid electronics boards are present, the platform can be positioned between two or more of the hybrid electronics boards.

Although elements have been shown or described as separate embodiments above, portions of each embodiment may be combined with all or part of other embodiments described above.

Although the present invention has been described with reference to preferred embodiments, workers skilled in the art will recognize that changes may be made in form and detail without departing from the spirit and scope of the invention.

What is claimed is:

1. An electronics package comprising:
   a platform;
   a board mounted to the platform, the board having electronics mounted thereon;
   at least one feedthrough body having an exterior surface, wherein the platform is mounted to the feedthrough body;
   a feedthrough pin, passing through and hermetically sealed to the feedthrough body and connected to the board; and
   a cover attached to and surrounding the exterior surface of the feedthrough body to produce a hermetically sealed chamber that houses the platform and the board such that the board is spaced from the feedthrough body and a surface of the feedthrough body is exposed to the sealed chamber;
   wherein a coefficient of thermal expansion of the platform and a coefficient of thermal expansion of the board are similar and selected to prevent the board from breaking free from the platform due to thermal expansion;
   a sensor body surrounding at least one sensor and having an exterior surface, wherein the cover is bonded to and surrounds a portion of the exterior surface of the sensor body and the sensor body is positioned opposite the feedthrough body and defines the hermetically sealed chamber of the cover therebtween; and
      wherein a coefficient of thermal expansion of the cover is different from the coefficient of thermal expansion of the board.

2. The electronics package of claim 1 wherein the platform is connected to the feedthrough body by at least one dowel.

3. The electronics package of claim 1 wherein the platform is mounted to the sensor body.

4. The electronics package of claim 1 wherein the bonds between the cover and the sensor body and the cover and the feedthrough body act as secondary containment of pressure when the sensor body is mounted to a process system.

5. The electronics package of claim 1 wherein the cover is cylindrical.

6. The electronics package of claim 1 wherein the platform is bonded to the feedthrough body by one of brazing and welding.

7. The electronics package of claim 6 wherein the platform comprises at least one notch positioned proximate to a location where the platform is bonded to the feedthrough body.

8. The electronics package of claim 1 wherein the platform and the board have similar thermal expansion characteristics.

9. The electronics package of claim 1 wherein the platform has different thermal expansion characteristics from the feedthrough body or the cover.

10. An electronics package comprising:
    a feedthrough body;
    a second body;
    a cover bonded to the feedthrough body and the second body to form a hermetically sealed chamber, the platform mounted to at least one of the feedthrough body and the second body;
    a platform positioned between a surface of the feedthrough body exposed to the sealed chamber and the second body within the sealed chamber; and
    a board having electrical components mounted thereon wherein the board is mounted to the platform within the chamber and is spaced from the feedthrough body;
    wherein a coefficient of thermal expansion of the platform and a coefficient of thermal expansion of the board are similar and selected to prevent the board from breaking free from the platform due to thermal expansion;
    wherein a coefficient of thermal expansion of the cover is different from the coefficient of thermal expansion of the board; and
    wherein the second body comprises a sensor body containing a sensor, the sensor body is positioned opposite feedthrough body and defines the hermetically sealed chamber of the cover therebetween.

11. The electronics package of claim 10 wherein the board is wire bonded to a conductor connected to the sensor.

12. The electronics package of claim 11 wherein the platform is mounted to the sensor body.

13. The electronics package of claim 12 wherein at least two pins extending from the feedthrough body are press fit into the platform.

14. The electronics package of claim 10 wherein the board is mounted to the platform by one of an adhesive and epoxy.

15. The electronics package of claim 10 wherein the board is mounted to the platform using spring rails.

16. The electronics package of claim 10 wherein the chamber further comprises a fill material between the board and the cover.

17. The electronics package of claim 10 wherein the board and the platform have similar thermal expansion characteristics to each other but the platform has different thermal expansion characteristics than the cover or feedthrough body.

* * * * *